United States Patent
Tsai et al.

(10) Patent No.: US 9,564,321 B2
(45) Date of Patent: Feb. 7, 2017

(54) CYCLIC EPITAXIAL DEPOSITION AND ETCH PROCESSES

(71) Applicant: Taiwan Semiconductor Manufacturing Co., Ltd., Hsin-Chu (TW)

(72) Inventors: Chun Hsiung Tsai, Xinpu Township (TW); Meng-Yueh Liu, Taoyuan (TW); Chien-Chang Su, Kaohsiung (TW); Yuan-Feng Chao, Hsinchu (TW); Yuh-Da Fan, Shin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/792,261

(22) Filed: Mar. 11, 2013

(65) Prior Publication Data

US 2014/0256119 A1    Sep. 11, 2014

(51) Int. Cl.
| | | |
|---|---|---|
| H01L 21/20 | (2006.01) | |
| H01L 21/36 | (2006.01) | |
| H01L 21/02 | (2006.01) | |
| H01L 21/3065 | (2006.01) | |

(52) U.S. Cl.
CPC ..... *H01L 21/0262* (2013.01); *H01L 21/02532* (2013.01); *H01L 21/02576* (2013.01); *H01L 21/02639* (2013.01); *H01L 21/02656* (2013.01); *H01L 21/3065* (2013.01)

(58) Field of Classification Search
CPC .......... H01L 21/02532; H01L 21/0262; H01L 21/02518; H01L 29/68
USPC ....... 438/507, 492, 283, 239, 478, 607, 216, 438/300, 305, 706, 424, 438, 481, 717, 438/99; 257/419, 443, 408, 324, 288, 301, 257/506, 390, 275, 72, 499, 327, 510, 257/306, 607
See application file for complete search history.

(56) References Cited

U.S. PATENT DOCUMENTS

| | | | |
|---|---|---|---|
| 4,372,808 A * | 2/1983 | Triplett et al. ................ 216/101 |
| 2006/0115934 A1 * | 6/2006 | Kim .................. H01L 21/02381 438/149 |
| 2006/0166414 A1 * | 7/2006 | Carlson ............ H01L 21/02381 438/149 |
| 2006/0169669 A1 * | 8/2006 | Zojaji ................... B08B 7/0035 216/58 |
| 2007/0006800 A1 * | 1/2007 | Lee ...................... C23C 16/4408 117/95 |
| 2007/0161216 A1 * | 7/2007 | Bauer ..................... C30B 25/02 438/503 |
| 2007/0287272 A1 * | 12/2007 | Bauer et al. .................. 438/485 |
| 2008/0026149 A1 * | 1/2008 | Tomasini ................ C23C 16/04 427/255.28 |
| 2009/0075029 A1 * | 3/2009 | Thomas ............ H01L 21/02381 428/173 |
| 2009/0093094 A1 * | 4/2009 | Ye et al. ........................ 438/197 |
| 2011/0061812 A1 * | 3/2011 | Ganguly ............. H01L 21/0223 156/345.34 |
| 2011/0117732 A1 * | 5/2011 | Bauer ................ H01L 21/02381 438/507 |
| 2011/0124169 A1 * | 5/2011 | Ye et al. ....................... 438/299 |
| 2011/0207323 A1 * | 8/2011 | Ditizio .......................... 438/675 |

(Continued)

*Primary Examiner* — Jessica Manno
*Assistant Examiner* — Sheikh Maruf
(74) *Attorney, Agent, or Firm* — Duane Morris LLP (57) ABSTRACT

A cyclic deposition and etch method is provided. The method includes depositing an epitaxial layer over a substrate at a first temperature and etching a portion of the deposited epitaxial layer at a variable temperature higher than the first temperature. The step of etching is performed while varying the temperature.

20 Claims, 9 Drawing Sheets

(56) References Cited

U.S. PATENT DOCUMENTS

2011/0312145 A1* 12/2011 Tsai et al. .................. 438/300
2012/0003825 A1*  1/2012 Dip ............................. 438/493
2012/0244688 A1*  9/2012 Bauer et al. ................ 438/507
2012/0295421 A1* 11/2012 Brabant et al. ............. 438/478

* cited by examiner

CYCLIC EPITAXIAL DEPOSITION AND ETCH PROCESSES

FIELD OF THE INVENTION

The present disclosure is directed generally to semiconductor processes and more particularly to cyclic epitaxial deposition and etch processes.

DESCRIPTION OF THE RELATED ART

Semiconductor processing is conventionally used in the fabrication of integrated circuits (IC). Chemical vapor deposition (CVD), in which atoms or molecules contained in a vapor are deposited on a surface to form a film, is a widely used deposition method in semiconductor processing. CVD permits the growth of films on surfaces, including "epitaxial" films. Epitaxial layers provide a smoother deposition surface and can also reduce junction leakage due to defects.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

With reference to the Figures, where like elements have been given like numerical designations to facilitate an understanding of the drawings, the various embodiments of cyclic deposition and etch methods are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved cyclic deposition and etch methods are provided. The processes described herein are not limited to any specific semiconductor process technology, production area, equipment, technology node, fabrication tool, wafer size, pattern type, pattern loading technique, etc. The inventors have developed cyclic deposition and etch methods that are capable of achieving high epitaxial layer or film quality, minimized dislocation and high etch efficiency in order to improve yield and decrease costs.

The inventors have observed that performance of epitaxial deposition processes at low temperatures improves epitaxial layer or film quality by, for example, permitting high carbon dopant concentration percentages and low resistivity. The inventors have also observed that epitaxial deposition processes at low pressures improves epitaxial layer or film quality by, for example, permitting a slower growth rate. The inventors have further observed that epitaxial etch processes at high temperatures and high pressures improves etch rate and etch efficiency.

The inventors have determined that cyclic epitaxial deposition and etch methods having substantially isothermal epitaxial deposition processes at low temperatures and low pressures and epitaxial etch processes at high, variable temperatures and high pressures improves epitaxial film quality, etch efficiency, and etching rate, minimizes dislocation, and minimizes requirements to use an etching rate catalyst (e.g. $GeH_4$). The inventors have determined that cyclic epitaxial deposition and etch methods having substantially isothermal epitaxial deposition processes at low temperatures and low pressures and epitaxial etch processes at high, variable temperatures and high pressures improves film quality including low defects, low dislocation, high phosphorous dopant activation, low film resistivity, high carbon dopant activation, low phosphorous dopant diffusion, high etch rate, high etch efficiency and high etch selectivity. As used herein, etch selectivity is a ratio of amorphous silicon to crystalline silicon. For example, the inventors have observed improved etching rates of ten times or more using cyclic epitaxial deposition and etch methods having substantially isothermal epitaxial deposition processes at low temperatures and low pressures and epitaxial etch processes at high, variable temperatures and high pressures compared to etching rates using isothermal cyclic deposition and etch processes.

Figure 1:
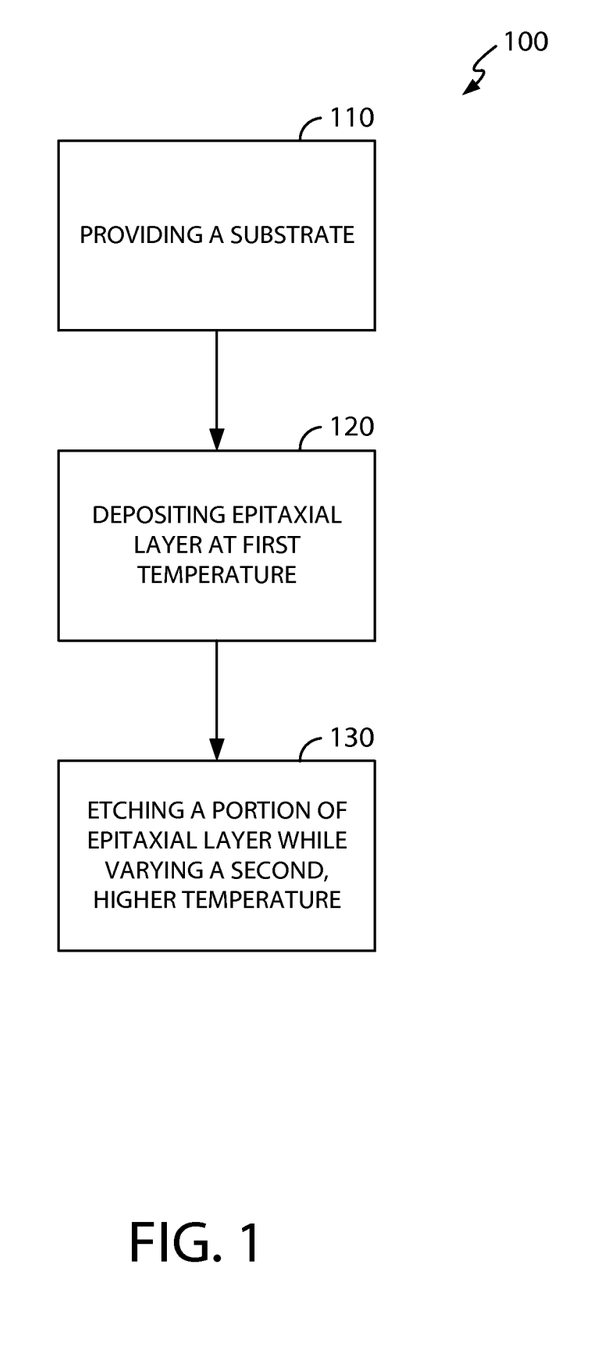
FIG. 1 is a flow chart illustrating a cyclic deposition and etch method according to embodiments of the present disclosure.

FIG. 1 is a flow chart illustrating a cyclic deposition and etch method 100 according to embodiments of the present disclosure. At block 110, a substrate is provided. In some embodiments, the substrate is a semiconductor wafer or die. In some embodiments, the substrate can be a p-type substrate. In another embodiment, the substrate can be an n-type substrate. The substrate can be formed from a material including, but not limited to, a Group IV elemental or compound semiconductor or a Group III-V semiconductor. The substrate can include silicon. The substrate can include another elementary semiconductor such as, for example, germanium. The substrate can also include a compound semiconductor such as, for example, silicon carbide, gallium arsenic, indium arsenide or indium phosphide. In some embodiments, the substrate is provided in a reactor chamber. The reactor chamber can be any suitable reactor chamber such as, for example, a hot wall reactor chamber or a cold wall reactor chamber. In various embodiments, the substrate is a blank silicon wafer. In some embodiments, the blank wafer is not pre-processed prior to being provided in a reactor chamber. In some embodiments, the substrate can undergo pre-clean process steps including, but not limited to, an etch, oxygen ($O_2$) strip, RCA clean or combinations thereof.

In some embodiments, one or more recesses can be formed in the substrate. For example, one or more recesses can be formed in the substrate using an etching process, e.g., a wet etch process, selective to the material of the substrate and using a hard mask to form the one or more recesses. In some embodiments, an etchant such as carbon tetrafluoride ($CF_4$), HF, tetramethylammonium hydroxide (TMAH), or combinations of thereof, or the like can be used to perform a wet etch and form the one or more recesses. The one or more recesses can provide one or more openings in the substrate into which one or more source/drain regions can subsequently be formed. In some embodiments, the substrate can be patterned to have two or more different types of deposition surfaces including, but not limited to, a semiconductor deposition surface, a dielectric deposition surface, or a metal deposition surface. In some embodiments, a recess formed in the substrate can provide a semiconductor deposition surfaces below and between surrounding dielectric deposition surfaces.

At block 120, an epitaxial layer is deposited over the substrate at a first temperature. The first epitaxial layer can be deposited by any suitable method. For example, in some embodiments, the epitaxial layer is deposited using a CVD process, such as, for example, a thermal CVD process, a low pressure CVD process, an atomic layer CVD process, a ultrahigh vacuum CVD process, or a reduced pressure CVD process, In some embodiments, the precursors introduced into a reactor chamber to grow the epitaxial layer can include, but are not limited to, silicon precursors such as monosilane ($SiH_4$), dichlorosilane ($H_2SiCl_2$ or DCS), disilane ($Si_2H_6$), trisilane ($Si_3H_8$), phosphorous precursors such as phosphine ($PH_3$), carbon-containing precursors such as monomethylsilane (MMS), or comixtures thereof. In some embodiments, the silicon precursors can be introduced at a flow rate between approximately 20 standard cubic centimeters per minute (sccm) (e.g. 19.5 sccm) and approximately 500 sccm (e.g. 505 sccm). In some embodiments, the step of depositing an epitaxial layer (120) includes in-situ doping of a silicon material of the epitaxial layer to achieve a predetermined dopant profile. For example, an n-type doping precursor, e.g. phosphine ($PH_3$), arsine ($AsH_3$), or any suitable n-type doping precursor, or co-mixtures thereof, can be introduced into a reactor chamber to n-type dope the silicon material of the epitaxial layer. In some embodiments, the n-type doping precursors can be introduced at a flow rate between approximately 20 standard cubic centimeters per minute (sccm) (e.g. 19.5 sccm) and approximately 500 sccm (e.g. 505 sccm). In some embodiments, the epitaxial layer can include a n-type doped silicon material doped with phosphorous (Si:P). In some embodiments, the epitaxial layer can include a n-type silicon material doped with phosphorous and carbon (Si:CP). In some embodiments, any suitable p-type doping precursor can be introduced into a reactor chamber to p-type dope the silicon material of the epitaxial layer. The inventors have determined that depositing the epitaxial layer over the substrate in a substantially isothermal deposition process at a low temperature improves epitaxial film quality. For example, the inventors have determined that low defects, low dislocation, higher phosphorous dopant activation, higher carbon dopant concentration (e.g. approximately 1-2% substitutional), low phosphorous dopant diffusion, and low resistivity (e.g. less than 0.7) can be achieved.

In some embodiments, the first temperature is less than 600° Celsius. In some embodiments, the first temperature is a temperature between approximately 500° Celsius (e.g. 495° Celsius) and 600° Celsius (e.g. 605° Celsius). In some embodiments, the first temperature is maintained substantially constant while performing the depositing step (block 120) such that the depositing step is performed under isothermal conditions. In some embodiments, the temperature can be measured using a temperature measuring device such as, for example, a temperature sensor, a thermocouple, a pyrometer, a thermistor, a resistance temperature detector (RTD), a platinum resistance thermometer (PRT), or any suitable temperature measuring device.

The inventors have further determined that depositing the epitaxial layer over the substrate in a substantially isobaric deposition process at a low pressure improves epitaxial film quality. For example, the inventors have determined that low defects, low dislocation, and low epitaxial growth rate can be achieved. In some embodiments, the pressure in a reactor chamber can be less than 50 Torr. In some embodiments, the pressure in a reactor chamber can be a pressure between approximately 1 Torr (e.g. 0.5 Torr) and 30 Torr (e.g. 35 Torr). In various embodiments, the pressure can be measured using any suitable pressure measuring device.

In some embodiments, the step of depositing an epitaxial layer (120) forms a thin epitaxial layer of substantially crystalline silicon (c-Si) material over one or more portions of the substrate and of substantially amorphous silicon (a-Si) material over another one or more portions of the substrate. In some embodiments, an epitaxial layer is deposited having one or more crystalline silicon material portions, one or more amorphous silicon material portions, and/or one or more polycrystalline material portions. For example, in some embodiments, an epitaxial layer can be deposited over a substrate patterned to have a semiconductor deposition surface and a dielectric deposition surface such that the deposited epitaxial layer comprises c-Si material over portions of the substrate having a semiconductor deposition surface and a-Si material over portions of the substrate having a dielectric deposition surface. In some embodiments, the step of depositing an epitaxial layer (120) forms a thin epitaxial layer of c-Si material in one or more recesses formed in a substrate and of a-Si material over surrounding substrate portions, e.g. surrounding substrate portions having a dielectric layer deposited over the respective substrate portions.

At block 130, a portion of the deposited epitaxial layer is etched at a variable temperature higher than the first temperature where the step of etching is performed while varying the temperature. In some embodiments, the precursors introduced into a reactor chamber to etch a portion of the epitaxial layer can include, but are not limited to, hydrogen chloride gas (HCl). In some embodiments, the step of etching the deposited epitaxial layer (130) is performed with an etch selectivity of greater than 1. For example, in some embodiments, the step of etching the deposited epitaxial layer (130) is performed with an etch selectivity of approximately 2 (e.g. 1.95-2.05). In some embodiments, the step of etching the deposited epitaxial layer (130) removes a-Si portions of the deposited epitaxial layer but removes only minimal amounts of the c-Si portions of the deposited epitaxial layer based on the etch selectivity value. In some embodiments, the step of etching the deposited epitaxial layer (130) removes portions of the deposited epitaxial layer including dislocations. The inventors have determined that etching a portion of the deposited epitaxial layer at a high temperature can increase the etch rate and improve etch efficiency. In various embodiments, the variable temperature can be higher than 600° Celsius. In some embodiments, the variable temperature can be varied between a temperature of approximately 600° Celsius (e.g. 595° Celsius) and 800° Celsius (e.g. 805° Celsius). In various embodiments, the temperature in the reactor chamber is varied between the deposition temperature and a predetermined terminal etch temperature. In some embodiments, the step of varying the temperature (130) is performed at a predetermined temperature rate of increase or ramping rate. For example, the temperature ramping rate can be a value between approximately 1° Celsius/second (e.g. 0.5° Celsius/s) and 180° Celsius (e.g. 185° Celsius). In some embodiments, the temperature ramping rate can be a value between approximately 1° Celsius/second (e.g. 0.5° Celsius/s) and 50° Celsius (e.g. 55° Celsius). For example, the temperature ramping rate can be a value between approximately 1° Celsius/second (e.g. 0.5° Celsius/s) and 20° Celsius (e.g. 21° Celsius).

In various embodiments, a temperature ramping rate can be achieved using one or more heating devices in a reactor chamber. For example, in some embodiments using a hot wall reactor chamber, a temperature ramping rate can be achieved by any suitable method such as, for example, using a resistive heating device, a RF induction heating device or a radiant heating device. By way of example, in some embodiments using a cold wall reactor chamber, a temperature ramping rate can be achieved using a device for heating the substrate and can be accomplished by any suitable method such as, for example, using an induction heating device or a radiant heating device. In some embodiments, the heat output of a heating device, such as, for example, a radiant heat lamp, a reflective surface, a resistive heating element, an RF induction heating element with a conductive susceptor, an induction furnace, or the like may be measured using a temperature measuring device. In some embodiments, the temperature in the reactor chamber can be varied using a closed loop process. For example, a temperature in the reactor chamber can be measured at predetermined intervals or continuously using a temperature monitoring device and the power output of a heating device in a reactor chamber can be adjusted based on measurements taken by the temperature monitoring device to maintain a precise temperature rate of increase or ramping rate. In some embodiments, the temperature in the reactor chamber can be varied using an open loop process. For example, one or more heating devices in a reactor chamber can provide a substantially constant power output to establish a temperature ramping rate.

The inventors have also determined that etching a portion of the deposited epitaxial layer at a high pressure can further increase the etch rate and improve etch efficiency. For example, in some embodiments, the pressure in a reactor chamber can be maintained at greater than 300 Torr during performance of the etching step (130). In some embodiments, the pressure in a reactor chamber can be maintained at a pressure between approximately 50 Torr (e.g. 45 Torr) and 600 Torr (e.g. 605 Torr) during performance of the etching step (130). For example, the pressure in a reactor chamber can be maintained at a pressure between approximately 300 Torr (e.g. 295 Torr) and 400 Torr (e.g. 405 Torr) during performance of the etching step (130). The inventors have further determined that etching a portion of the deposited epitaxial layer at a high etchant (e.g. HCl) concentration can also increase the etch rate and improve etch efficiency. For example, in some embodiments, the etchant (e.g. HCl) concentration introduced into a reactor chamber can be maintained at greater than 15000 sccm during performance of the etching step (130). In some embodiments, the etchant (e.g. HCl) concentration introduced into a reactor chamber can be maintained at a concentration between approximately 200 sccm (e.g. 195 sccm) and 20000 sccm (e.g. 20050 sccm) during performance of the etching step (130).

The inventors have observed that the etch rate, etch amount and etch selectivity can be determined by various factors including deposition temperature (block 110), the slope of a temperature ramping rate curve, a terminal etch temperature, etchant concentration during performance of the etching step (130) and pressure during performance of the etching step (130). In some embodiments, etchant concentration and pressure can be maintained substantially constant while performing the etching step (block 130) such that etch rate, etch amount and etch selectivity can be controlled by initial ramping temperature, terminal etch or ramping temperature, and the temperature ramping rate. In some embodiments, the depositing (120) and etching (130) steps are repeated in the cyclic deposition and etch method 100 to deposit epitaxial material having a predetermined thickness over the substrate.

Figure 2:
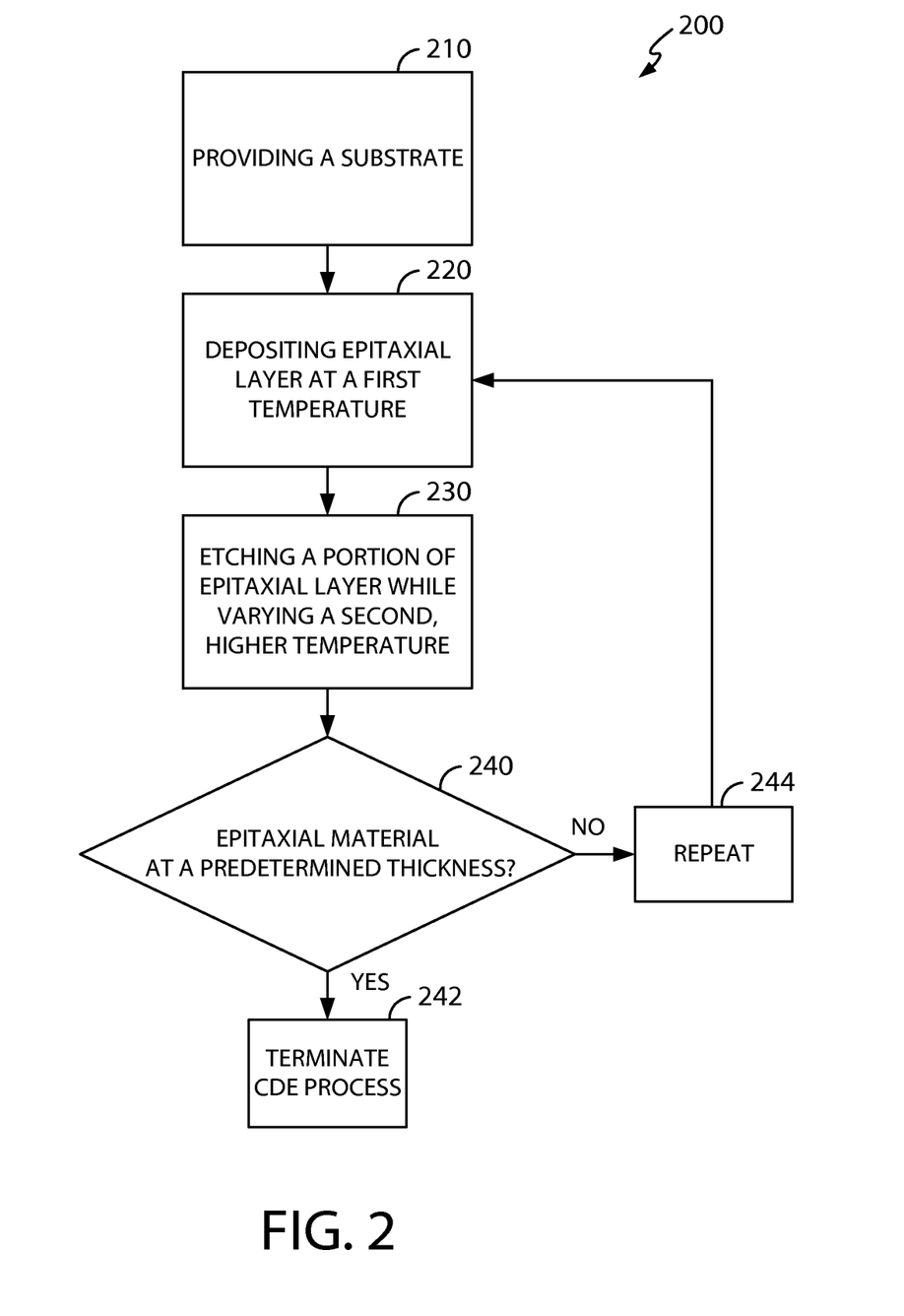
FIG. 2 is a flow chart illustrating a cyclic deposition and etch method according to some embodiments.

With reference now to FIG. 2, a flow chart illustrating a cyclic deposition and etch method 200 according to some embodiments of the present disclosure is provided. Blocks 210 to 230 illustrate steps of a cyclic deposition and etch method that are substantially similar to that described above for blocks 110 to 130. At block 240, a determination is made as to whether epitaxial material deposited over the substrate has a predetermined thickness. At block 242, if a determination is made that epitaxial material deposited over the substrate has a predetermined thickness, the cyclic deposition and etch process is terminated. At block 244, if a determination is made that epitaxial material deposited over the substrate has not reached a predetermined thickness, the depositing (220) and etching (230) steps are repeated. In some embodiments, a predetermined thickness can be a value between approximately 10 (e.g. 9) and approximately 30 (e.g. 31) nanometers. In some embodiments, performance of the depositing (220) and etching (230) steps can result in an epitaxial layer per cycle having a thickness between approximately 10 (e.g. 9) and approximately 30 (e.g. 31) Angstroms. In some embodiments, the depositing (220) and etching (230) steps are repeated between 10 and 20 times until epitaxial material having a predetermined thickness is deposited over the substrate. In some embodiments, performance of the depositing (220) and etching (230) steps can result in an epitaxial layer per cycle having a thickness of approximately 20 Angstroms (e.g. 19-21 Angstroms).

The thickness of the epitaxial layer, and/or epitaxial material deposited over the substrate, can be measured by any suitable method. In some embodiments, a predetermined thickness of the deposited epitaxial material can be determined based on cyclically depositing epitaxial material at a predetermined deposition temperature (first temperature) for a predetermined period of time. In some embodiments, a predetermined thickness of the deposited epitaxial material can be determined based on cyclically depositing epitaxial material at a predetermined deposition temperature (first temperature) for a predetermined period of time at a predetermined etch selectivity. In some embodiments, the epitaxial layer (epitaxial material) thickness can be measured using X-ray reflectometry (XRR). For example, x-rays can be introduced into the reactor chamber and reflected from each surface/interface of the epitaxial layer and substrate where an electron density changes. The reflections from several interfaces may lead to a fringe pattern due to phase shift and interference. The phase shift and interference can allow for measurement of the thickness of the epitaxial layer (epitaxial material). In some embodiments using XRR, the thickness measurement can be performed at a glancing angle with the specular reflection of the X-rays being detected by a detector, the intensity recorded as a function of an angle of incidence, and the fringe period measured relating to the thickness of the epitaxial layer (epitaxial material). In some embodiments, a material density of the epitaxial layer (epitaxial material) can be measured using XRR. In some embodiments, the epitaxial layer (epitaxial material) thickness can be measured using XRR and X-ray fluorescence (XRF). In some embodiments, the thickness of the epitaxial layer (epitaxial material) is measured using X-ray diffraction (XRD). The epitaxial layer thickness can also be measured using ellipsometry where light reflection at the interface between the epitaxial layer and substrate is dependent upon the polarization of the light emitted toward the layered substrate.

Figure 3:
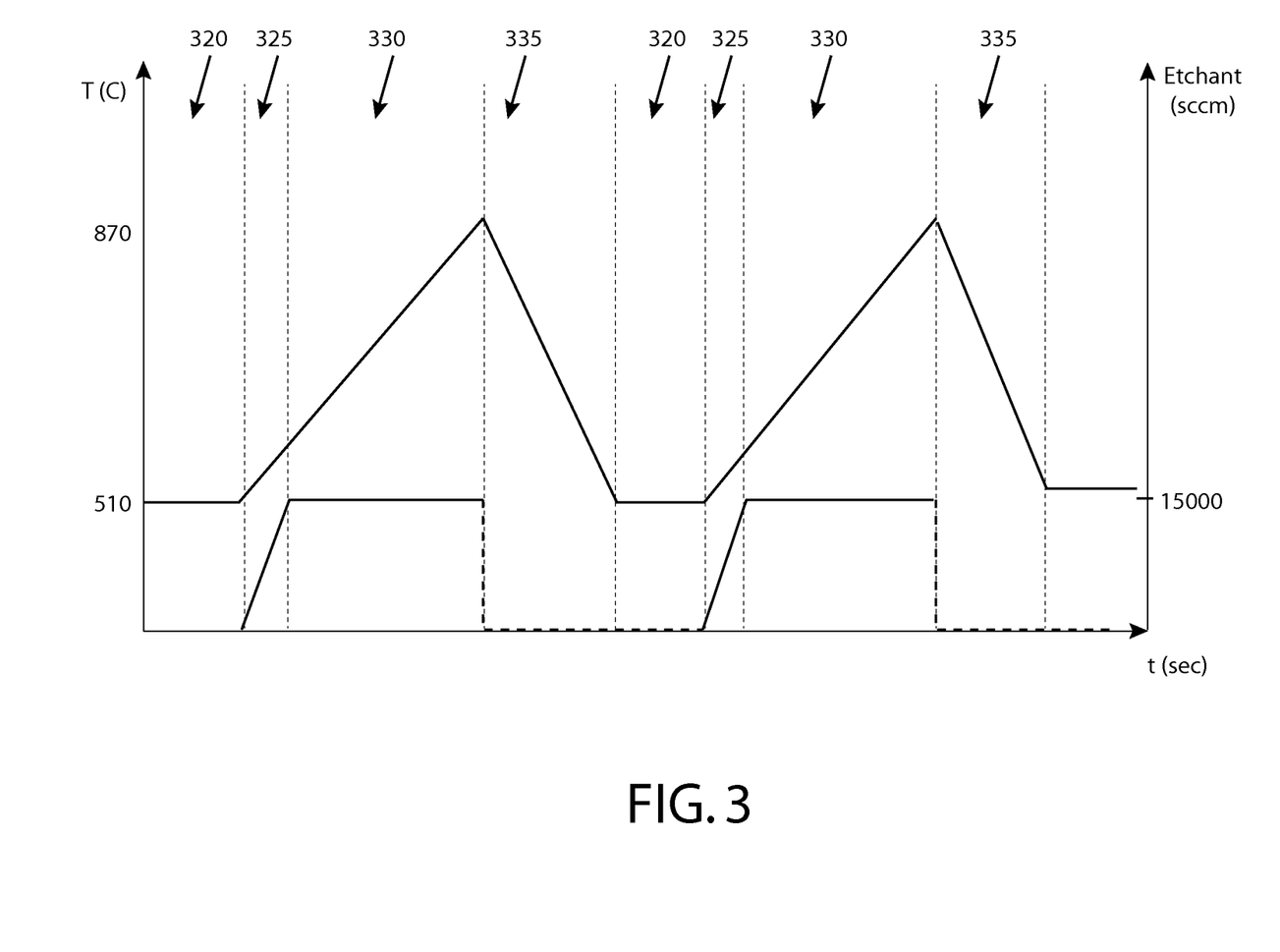
FIG. 3 is a diagram illustrating an example of a relationship between temperature, time and etchant concentration for a cyclic deposition and etch process.

Referring now to FIG. 3, a diagram illustrating an example of a relationship between temperature, time and etchant concentration for a cyclic deposition and etch process is provided. In region 320, epitaxial material is deposited (120, 220) over a substrate at a first temperature of 510° Celsius. As shown in FIG. 3, etchant concentration in region 320 is 0 sccm. In region 325, etchant is introduced into a reactor chamber and etchant concentration ramps up from 0 to 15000 sccm while temperature in the reactor chamber is increased at a temperature ramping rate. In the illustrated example, temperature increases from deposition temperature of 510° Celsius to 600° Celsius in region 325 to establish a temperature ramping rate of 30° Celsius/second. In region 330, a portion of the deposited epitaxial layer is etched while varying the temperature in the reactor chamber at the temperature ramping rate (130, 230). In region 330, etchant concentration is shown as maintained substantially constant at 15000 sccm and temperature is shown as linearly increasing at a temperature ramping rate of 30° Celsius/second until a terminal etch temperature of 870° Celsius is achieved and etchant introduction into the reactor chamber is ceased. In region 335, temperature is illustrated as bring ramped down and returned to the deposition temperature for a second deposition and etch cycle. As shown in FIG. 3, the deposition and etch process illustrated in regions 320-335 is repeated.

Figure 4:
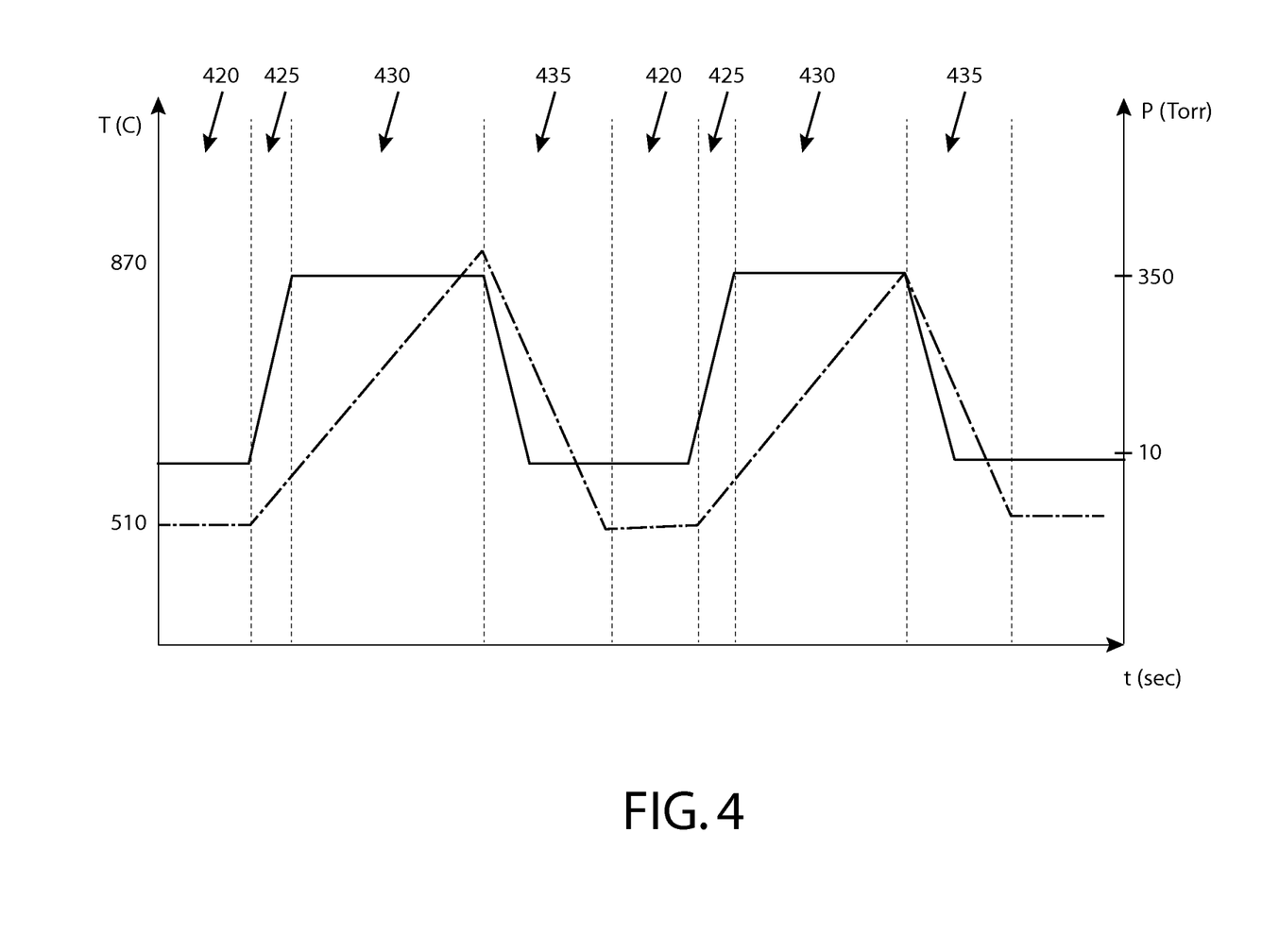
FIG. 4 is a diagram illustrating an example of a relationship between temperature, time and pressure for a cyclic deposition and etch process.

FIG. 4 provides a diagram illustrating an example of a relationship between temperature, time and pressure for a cyclic deposition and etch process. In region 420, epitaxial material is deposited (120, 220) over a substrate at a first temperature of 510° Celsius and a first pressure of 10 Torr. In region 425, etchant is introduced into a reactor chamber while temperature in the reactor chamber is increased at a temperature ramping rate and pressure is increased from a first pressure of 10 Torr to a second pressure of 350 Torr. Pressure can be increased in the reactor chamber by any suitable method. For example, in some embodiments, a servo pressure controller increases the pressure in the reactor chamber. In the illustrated example, temperature increases from deposition temperature of 510° Celsius to 600° Celsius in region 425 to establish a temperature ramping rate of 30° Celsius/second. In region 430, a portion of the deposited epitaxial layer is etched while varying the temperature in the reactor chamber at the temperature ramping rate (130, 230). In region 430, pressure is shown as maintained substantially constant at 350 Torr and temperature is shown as linearly increasing at a temperature ramping rate of 30° Celsius/second until a terminal etch temperature of 870° Celsius is achieved and etchant introduction into the reactor chamber is ceased. In region 435, temperature is illustrated as bring ramped down and returned to the deposition temperature for a second deposition and etch cycle. As shown in FIG. 4, the deposition and etch process illustrated in regions 420-435 is repeated. The inventors have observed that a cyclic deposition and etch process as described and illustrated herein improves film quality and improves etch efficiency at removing amorphous silicon and dislocation and defects at, for example, gate corners, with high etch rates.

Figure 5:
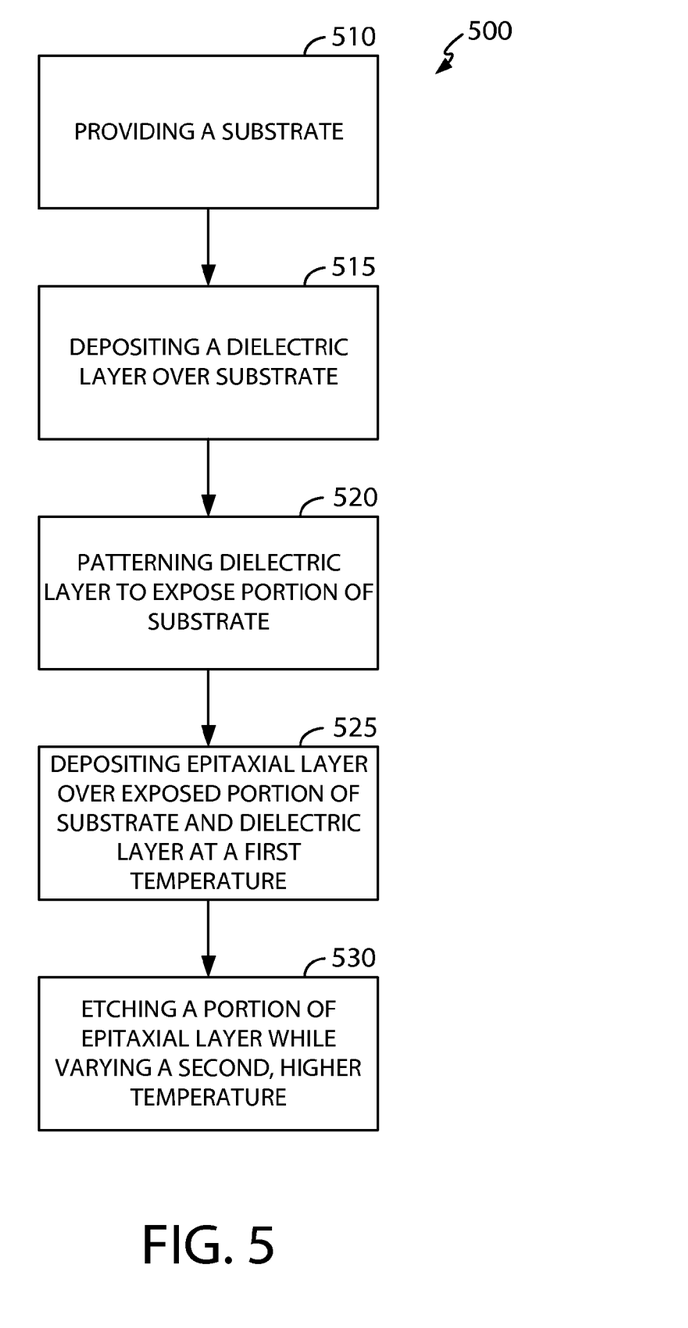
FIG. 5 is a flow chart illustrating a cyclic deposition and etch method according to embodiments of the present disclosure.

With reference now to FIG. 5, a flow chart illustrating a cyclic deposition and etch method 500 according to embodiments of the present disclosure is provided. At block 510, a substrate is provided as described for blocks 110 and 210. At block 515, a dielectric layer is deposited over the substrate at a first temperature. The dielectric layer can be deposited by any suitable method. In various embodiments, the dielectric layer is formed of a dielectric material. The dielectric material can be, for example, a low-k dielectric material. The dielectric material can include aluminum-containing dielectrics, such as $Al_2O_3$, HfAlO, HfAlON, AlZrO, Hf-containing materials, such as $HfO_2$, $HfSiO_x$, $HfAlO_x$, $HfZrSiO_x$, HfSiON, other materials such as $LaAlO_3$ and $ZrO_2$ and/or any other suitable material. At block 520, the dielectric layer is patterned to expose at least a portion of the substrate. The dielectric layer can be patterned by any suitable method. At block 520, an epitaxial layer is deposited over the exposed at least a portion of the substrate and over the patterned dielectric layer. The epitaxial layer can be deposited using any suitable deposition process including, for example, a chemical vapor deposition (CVD) process. In various embodiments, the step of depositing an epitaxial layer 520 is performed using a non-selective deposition process. At block 530, a portion of the deposited epitaxial layer is etched at a variable temperature higher than the first temperature where the step of etching is performed while varying the temperature as described at blocks 130 and 230. In various embodiments, the step of etching 530 is performed using a selective etching process. For example, the step of etching 530 is performed to remove amorphous silicon (a-Si) portions and dislocation portions of the epitaxial layer while substantially retaining crystalline silicon (c-Si) portions of the epitaxial layer. In some embodiments, the step of etching is performed with an etch selectivity of greater than 1. For example, in some embodiments, the step of etching the deposited epitaxial layer (530) is performed with an etch selectivity of approximately 2 (e.g. 1.95-2.05).

Figure 6:
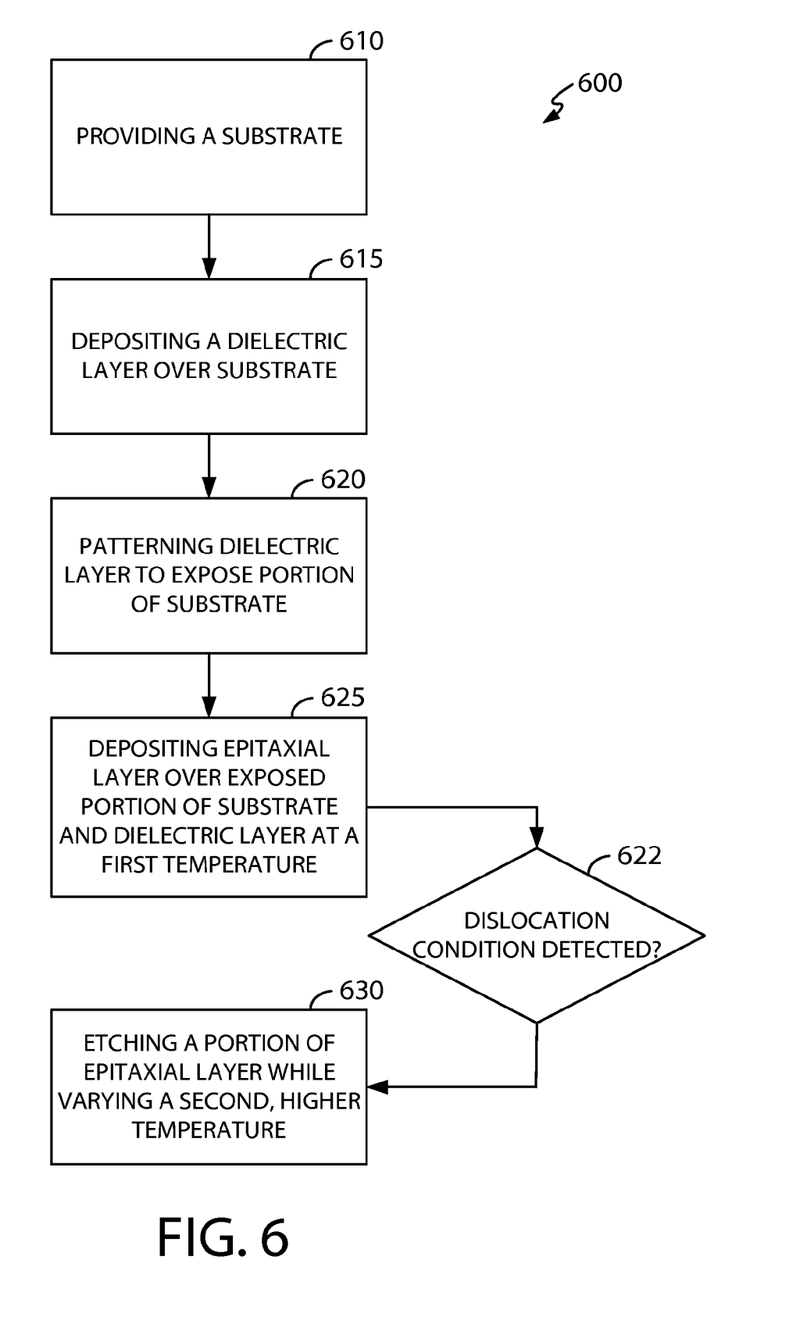
FIG. 6 is a flow chart illustrating a cyclic deposition and etch method according to some embodiments.

FIG. 6 is a flow chart illustrating a cyclic deposition and etch method 600 according to embodiments of the present disclosure is provided. Blocks 610, 615 and 620 illustrate steps of a cyclic deposition and etch method that are substantially similar to that described above for blocks 510, 515 and 520. At block 622, a dislocation condition is detected at a portion of the deposited epitaxial layer. The portion of the deposited epitaxial layer having a dislocation condition can be detected using any suitable method including, for example, transmission electron microscopy (TEM). In some embodiments, a gate corner dislocation condition can be detected at a portion of the deposited epitaxial layer. At block 630, a portion of the deposited epitaxial layer is etched, including a portion having a dislocation condition at a variable temperature higher than the first temperature where the step of etching is performed while varying the temperature as described at blocks 130 and 230.

Figure 7:
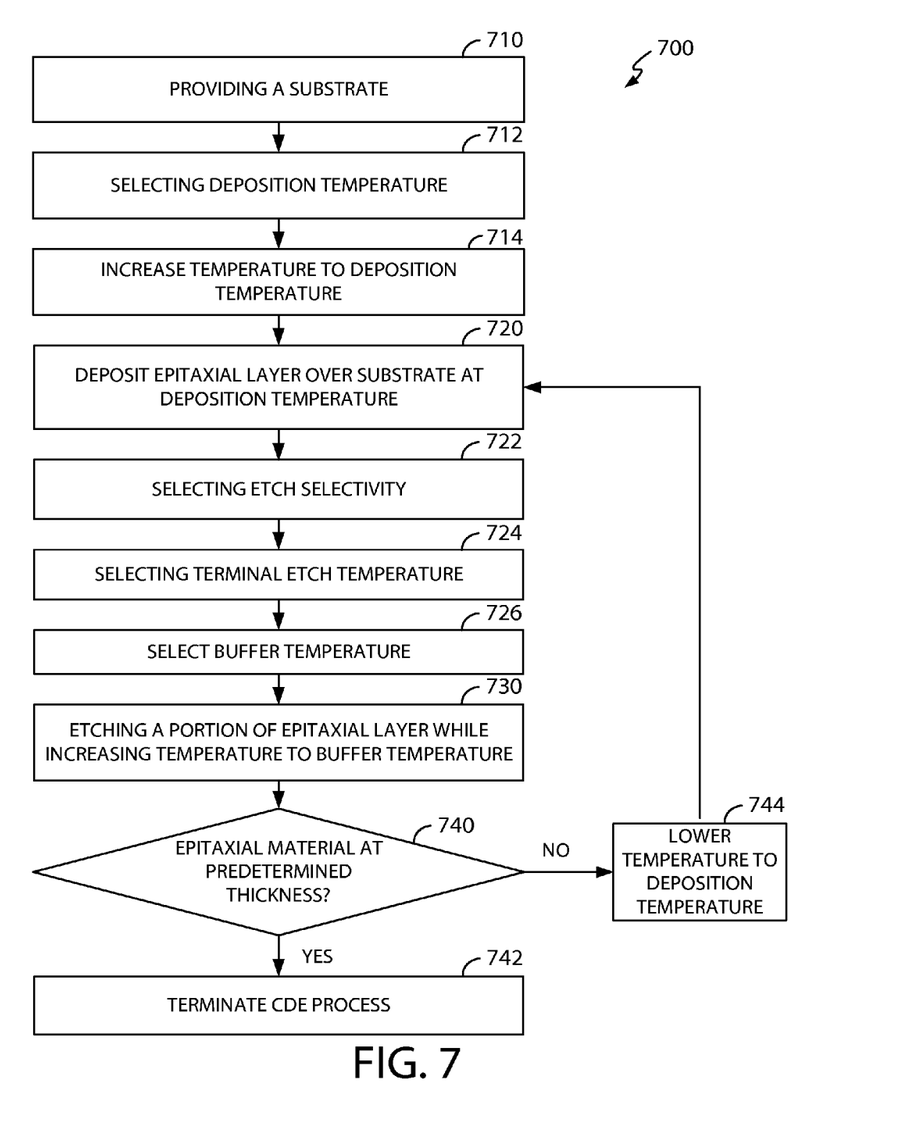
FIG. 7 is a flow chart illustrating a cyclic deposition and etch method according to embodiments of the present disclosure.

Referring to FIG. 7, a flow chart illustrating a cyclic deposition and etch method 700 according to embodiments of the present disclosure is provided. At block 710, a substrate is provided in a reactor chamber in a substantially similar manner to that described above for block 610 (510, 210, 110). At block 712, a deposition temperature is selected. In some embodiments, the deposition temperature is selected to maximize high phosphorous dopant activation, high carbon dopant activation and film quality, minimize defects, dislocation, film resistivity, and phosphorous dopant diffusion and/or control epitaxial layer growth rate. The selection of a deposition temperature can be factor-dependent including, but not limited to, wafer-dependent, recipe dependent, tool dependent, chamber dependent, pattern-dependent, precursor-dependent, pressure-dependent, etc. At block 714, a temperature in the reactor chamber is increased to the selected deposition temperature. At block 720, an epitaxial layer is deposited over the substrate at the selected deposition temperature in a substantially similar manner to that described above for block 620 (520, 220, 120). At block 722, an etch selectivity is selected. In some embodiments, an etch selectivity of greater than 1 is selected. In some embodiments, an etch selectivity of greater than 2 is selected. At block 724, a terminal etch temperature is selected. In some embodiments, the terminal etch temperature is selected to maximize etch rate, etch efficiency, and etch selectivity. The selection of a terminal etch temperature can be factor-dependent including, but not limited to, wafer-dependent, recipe dependent, tool dependent, chamber dependent, pattern-dependent, etchant-dependent, etchant concentration-dependent, pressure-dependent, etc. At block 726, a buffer temperature can be selected. In various embodiments, the selected buffer temperature is higher than the terminal etch temperature. A buffer temperature can be selected to minimize overshooting. For example, different wafer sizes, pattern types, pattern loading techniques, tools, pattern loading techniques, equipment, technology nodes, and/or recipes can have different temperature variations. By way of example, emissivity induced temperature variation, pattern loading effect induced temperature variation, and/or time-to-time and tool-to-tool temperature variations can exist between different wafer sizes, pattern types, pattern loading techniques, tools, pattern loading techniques, equipment, technology nodes, and/or recipes. A buffer temperature can be selected to account for such variations and minimize overshooting.

At block 730, a portion of the deposited epitaxial layer is etched while increasing the temperature in the reactor chamber to the selected buffer temperature while varying the temperature in the reactor chamber as described at blocks 630 (530, 130, 230). At block 740, a determination is made as to whether epitaxial material deposited over the substrate has a predetermined thickness in a substantially similar manner to that described above for block 240. At block 742, if a determination is made that epitaxial material deposited over the substrate has a predetermined thickness, the cyclic deposition and etch process is terminated. At block 744, if a determination is made that epitaxial material deposited over the substrate has not reached a predetermined thickness, the depositing (220) and etching (230) steps are repeated. As shown in block 744, the temperature in the reactor chamber is decreased to the selected deposition temperature.

Figure 8:
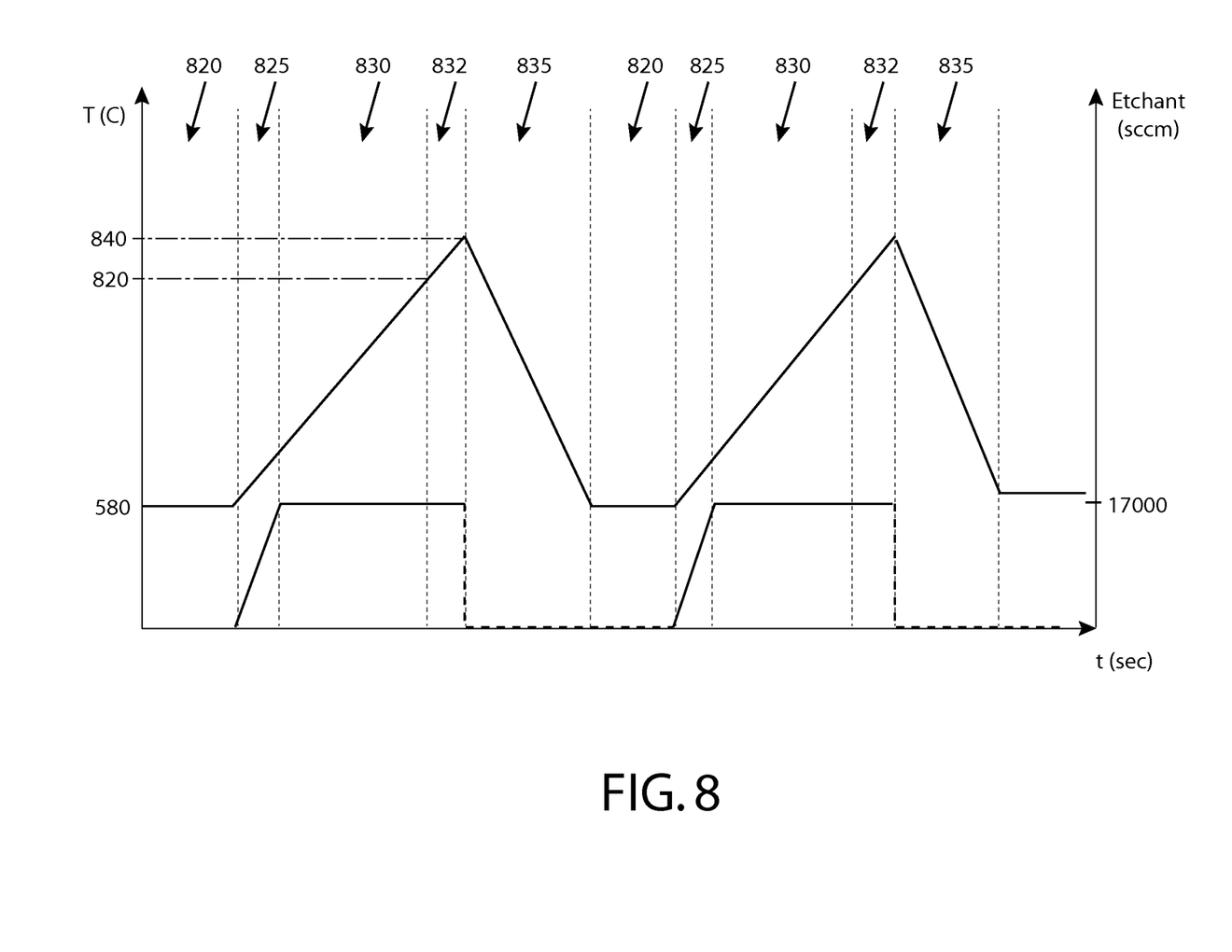
FIG. 8 is a diagram illustrating an example of a relationship between temperature, time and etchant concentration for a cyclic deposition and etch process.

Referring now to FIG. 8, a diagram illustrating an example of a relationship between temperature, time and etchant concentration for a cyclic deposition and etch process is provided. In region 820, epitaxial material is deposited over a substrate at a first temperature of 580° Celsius. As shown in FIG. 8, etchant concentration in region 820 is 0 sccm. In region 825, etchant is introduced into a reactor chamber and etchant concentration ramps up from 0 to 17000 sccm while temperature in the reactor chamber is increased at a temperature ramping rate. In the illustrated example, temperature increases from deposition temperature of 580° Celsius to 620° Celsius in region 825 to establish a temperature ramping rate of about 10° Celsius/second. In regions 830 and 832, a portion of the deposited epitaxial layer is etched while varying the temperature in the reactor chamber at the temperature ramping rate. In regions 830 and 832, etchant concentration is shown as maintained substantially constant at 17000 sccm and temperature is shown as linearly increasing at a temperature ramping rate of about 10° Celsius/second. In region 832, the temperature in the reactor chamber is increased at the temperature ramping rate past a terminal etch temperature of 820° Celsius until a buffer temperature of 840° Celsius is achieved and etchant introduction into the reactor chamber is ceased. In region 835, temperature is illustrated as bring ramped down and returned to the deposition temperature for a second deposition and etch cycle. As shown in FIG. 8, the deposition and etch process illustrated in regions 820-835 is repeated.

Figure 9:
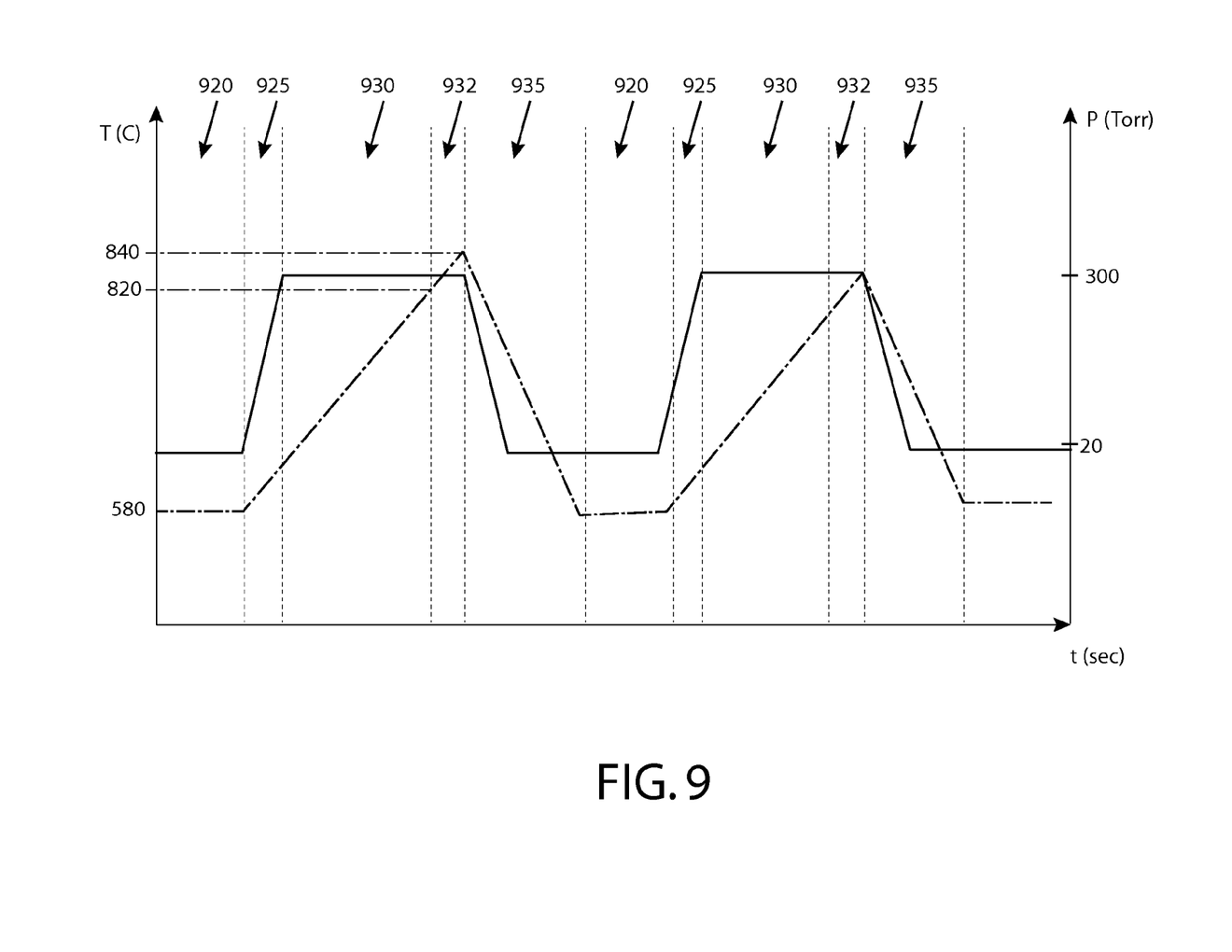
FIG. 9 is a diagram illustrating an example of a relationship between temperature, time and pressure for a cyclic deposition and etch process.

FIG. 9 is a diagram of an example of a relationship between temperature, time and pressure for a cyclic deposition and etch process. In region 920, epitaxial material is deposited over a substrate at a deposition temperature of 580° Celsius and a first pressure of 10 Torr. In region 825, etchant is introduced into a reactor chamber while temperature in the reactor chamber is increased at a temperature ramping rate and pressure is increased from a first pressure of 20 Torr to a second pressure of 300 Torr. Pressure can be increased in the reaction chamber by any suitable method. In the illustrated example, temperature increases from deposition temperature of 580° Celsius to 620° Celsius in region 925 to establish a temperature ramping rate of 20° Celsius/second. In regions 930 and 932, a portion of the deposited epitaxial layer is etched while varying the temperature in the reactor chamber at the temperature ramping rate. In regions 930 and 932, pressure is shown as maintained substantially constant at 300 Torr and temperature is shown as linearly increasing at a temperature ramping rate of 20° Celsius/second. In region 932, the temperature in the reactor chamber is increased at the temperature ramping rate past a terminal etch temperature of 820° Celsius until a buffer temperature of 840° Celsius is achieved and etchant introduction into the reactor chamber is ceased. In region 935, temperature is illustrated as bring ramped down and returned to the deposition temperature for a second deposition and etch cycle. As shown in FIG. 9, the deposition and etch process illustrated in regions 920-935 is repeated.

In some embodiments, steps of the method can be implemented (e.g., controlled and/or monitored) by a general purpose computer programmed in accordance with the principals discussed herein. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Embodiments of the subject matter and the functional operations for various steps of processes described in this specification can be implemented in electronic circuitry, or in computer firmware, or hardware, including the structures disclosed in this specification and their equivalents, or in combinations of one or more of them. Embodiments of the subject matter described in this specification can be implemented as one or more computer program products, i.e., one or more modules of computer program instructions encoded on a non-transitory, tangible machine readable storage medium for execution by, or to control the operation of, data processing apparatus. The non-transitory, tangible storage medium can be a non-transitory computer readable storage medium. The computer readable medium can be a machine-readable storage device, a machine-readable storage medium, a memory device (e.g., flash or random access memory), a hard disk drive, a tape drive, an optical drive (such as, but not limited to CDROM, DVD, or BDROM) or the like, or a combination of one or more of them.

Various embodiments can be implemented in a computing system that includes a back end component, e.g., as a data server, or that includes a middleware component, e.g., an application server, or that includes a front end component, e.g., a computer having a GUI or a Web browser through which an operator can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Some embodiments provide a cyclic deposition and etch method. An epitaxial layer is deposited over a substrate at a first temperature. A portion of the deposited epitaxial layer is etched at a variable temperature higher than the first temperature. The step of etching is performed while varying the temperature.

Some embodiments provide a cyclic deposition and etch method. An epitaxial layer is deposited over a substrate at a first temperature in a reactor chamber. A portion of the epitaxial layer is etched at an etch selectivity of greater than 1 while increasing the temperature in the reactor chamber between a second temperature and a third temperature. The second and third temperatures are higher than the first temperature.

Some embodiments provide a cyclic deposition and etch method. A dielectric layer is deposited over a substrate. The dielectric layer is patterned to expose at least a portion of the substrate. An epitaxial layer is deposited over the exposed at least a portion of the substrate and over the patterned dielectric layer in a reactor chamber. The temperature in the reactor chamber is varied between a first predetermined temperature and a temperature higher than a second predetermined temperature while a portion of the deposited epitaxial layer is etched.

While various embodiments are described herein, it is to be understood that the embodiments described are illustrative only and that the scope of the subject matter is to be accorded a full range of equivalents, many variations and modifications naturally occurring to those of skill in the art from a perusal hereof.

What we claim is:

1. A cyclic deposition and etch method, comprising:
   depositing an epitaxial layer over a substrate at a first temperature in a reactor chamber;
   after performing the depositing step, raising the temperature in the reactor chamber from the first temperature and at a predetermined temperature ramping rate while maintaining the substrate in the reactor chamber; and
   etching a portion of the deposited epitaxial layer while performing the step of raising the temperature in the reactor chamber.

2. The method of claim 1, further comprising:
   maintaining the first temperature in the reactor chamber substantially constant while performing the depositing step.

3. The method of claim 1, further comprising:
   after performing the depositing step, raising a pressure in the reactor chamber from a first predetermined pressure to a second predetermined pressure while raising the temperature in the reactor chamber from the first temperature to a second temperature at the predetermined temperature ramping rate and while maintaining the substrate in the reactor chamber; and maintaining the pressure in the reactor chamber substantially constant at the second predetermined pressure while raising the temperature in the reactor chamber from the second temperature to a third temperature at the predetermined temperature ramping rate; wherein the step of depositing is performed at the first predetermined pressure; and wherein the step of etching is performed at the second predetermined pressure.

4. The method of claim 1, wherein the predetermined temperature ramping rate is a value between 1 and 50 degrees Celsius per second.

5. The method of claim 1, wherein the predetermined temperature ramping rate is a value between 1 and 10 degrees Celsius per second.

6. The method of claim 1, wherein the step of raising the temperature in the reactor chamber further comprises:
monitoring the temperature in the reactor chamber while performing the etching step; and
based on a result of the monitoring step, adjusting a heating device to maintain the predetermined temperature ramping rate.

7. The method of claim 1, further comprising:
depositing a dielectric layer over the substrate before the step of depositing an epitaxial layer is performed.

8. The method of claim 1, wherein the step of etching a portion of the deposited epitaxial layer is performed with an etch selectivity of greater than 1.

9. The method of claim 8, wherein the etch selectivity is approximately 2.

10. The method of claim 1, further comprising:
detecting a dislocation condition at a subsurface portion of the deposited epitaxial layer, and
wherein the step of etching a portion of the deposited epitaxial layer comprises etching the subsurface dislocation portion.

11. The method of claim 1, wherein the step of etching further comprises:
introducing an etchant comprising HCl to a predetermined etchant concentration while raising the temperature in the reactor chamber from the first temperature to a second temperature at the predetermined temperature ramping rate; and
maintaining the etchant concentration substantially constant while raising the temperature in the reactor chamber from the second temperature to a third temperature at the predetermined temperature ramping rate.

12. A cyclic deposition and etch method, comprising:
depositing an epitaxial layer over a substrate at a first temperature in a reactor chamber;
after performing the depositing step, increasing the temperature in the reactor chamber from the first temperature and at a predetermined temperature ramping rate while maintaining the substrate in the reactor chamber; and
etching a portion of the deposited epitaxial layer with an etch selectivity greater than 1 while increasing the temperature in the reactor chamber between a second temperature and a third temperature at the predetermined temperature ramping rate, wherein the second and third temperatures are higher than the first temperature.

13. The method of claim 12, wherein the third temperature is higher than a predetermined terminal etch temperature.

14. The method of claim 12, further comprising:
depositing a dielectric layer over the substrate; and
patterning the dielectric layer to expose at least a portion of the substrate;
and wherein the step of etching a portion of the deposited epitaxial layer comprises etching the portion of the deposited epitaxial layer deposited over the dielectric layer.

15. A cyclic deposition and etch method, comprising:
depositing a dielectric layer over a substrate;
patterning the dielectric layer to expose at least a portion of the substrate;
depositing an epitaxial layer over the exposed at least a portion of the substrate and over the patterned dielectric layer in a reactor chamber;
after performing the depositing step, raising the temperature in the reactor chamber at a predetermined temperature ramping rate between a first predetermined temperature and a second temperature higher than a third temperature while etching a portion of the deposited epitaxial layer and while maintaining the substrate in the reactor chamber;
monitoring the temperature in the reactor chamber while performing the etching step; and
based on a result of the monitoring step, adjusting a heating device to maintain the predetermined temperature ramping rate.

16. The method of claim 15, wherein the step of etching a portion of the deposited epitaxial layer comprises etching the portion of the deposited epitaxial layer deposited over the patterned dielectric layer.

17. The method of claim 14, further comprising:
detecting a subsurface dislocation condition at a portion of the deposited epitaxial layer, and
wherein the step of etching a portion of the deposited epitaxial layer comprises etching the subsurface dislocation portion.

18. The method of claim 16 further comprising:
detecting a subsurface dislocation condition at a portion of the deposited epitaxial layer, and
wherein the step of etching a portion of the deposited epitaxial layer comprises etching the subsurface dislocation portion.

19. The method of claim 12, further comprising:
raising a pressure in the reactor chamber from a first predetermined pressure to a second predetermined pressure while raising the temperature in the reactor chamber from the first temperature to the second temperature at the predetermined temperature ramping rate; and
maintaining the pressure in the reactor chamber substantially constant at the second predetermined pressure while raising the temperature in the reactor chamber at the predetermined temperature ramping rate; wherein the step of depositing is performed at the first predetermined pressure; and wherein the step of etching is performed at the second predetermined pressure.

20. The method of claim 1, further comprising:
after performing the etching, lowering the temperature in the reactor chamber to the first temperature;
depositing another epitaxial layer over the remaining portion of the etched epitaxial layer at the first temperature in the rector chamber; and
after performing the depositing another epitaxial layer, raising the temperature in the reactor chamber from the first temperature and at a predetermined temperature ramping rate while maintaining the substrate in the reactor chamber; and etching a portion of the deposited another epitaxial layer while performing the step of raising the temperature in the reactor chamber.

* * * * *